United States Patent [19]

Batchelder et al.

[11] Patent Number: 5,432,670
[45] Date of Patent: Jul. 11, 1995

[54] GENERATION OF IONIZED AIR FOR SEMICONDUCTOR CHIPS

[75] Inventors: John S. Batchelder, Tarrytown, N.Y.; Vaughn P. Gross, St. Albans; Robert A. Gruver, Essex Junction, both of Vt.; Philip C. D. Hobbs, Ossining, N.Y.; Kenneth D. Murray, Huntington, Vt.

[73] Assignee: International Business Machines Corporation, Armonk, N.Y.

[21] Appl. No.: 166,509

[22] Filed: Dec. 13, 1993

Related U.S. Application Data

[60] Division of Ser. No. 895,181, Jun. 5, 1992, Pat. No. 5,316,970, which is a continuation of Ser. No. 571,805, Aug. 23, 1990, abandoned.

[51] Int. Cl.$^6$ .................................................. H05F 3/06
[52] U.S. Cl. ........................................ 361/213; 250/423 P
[58] Field of Search .................... 250/423 P, 324–326, 250/492.21, 424, 423 R; 437/173; 361/212–216, 225–231

[56] References Cited

U.S. PATENT DOCUMENTS

| | | | |
|---|---|---|---|
| 2,881,335 | 4/1959 | Vonnegut | 361/226 |
| 3,210,007 | 10/1965 | Doyle et al. | 239/3 |
| 3,397,631 | 8/1968 | Simons | 55/DIG. 29 |
| 3,403,252 | 9/1968 | Nagy | 250/432 R |
| 3,443,087 | 5/1969 | Robieux et al. | 250/284 |
| 3,512,173 | 5/1970 | Damouth | 361/226 |
| 3,573,454 | 4/1971 | Andersen | 250/492.21 |
| 3,675,096 | 7/1972 | Kiess | 250/325 |
| 3,719,829 | 3/1973 | Vaill | 307/149 |
| 3,757,491 | 9/1973 | Gourdine | 96/27 |
| 3,761,941 | 9/1973 | Robertson | 361/226 |
| 3,790,079 | 2/1974 | Berglund et al. | 239/3 |
| 3,914,655 | 10/1975 | Dreyfus et al. | 361/230 |
| 3,923,482 | 12/1975 | Knab et al. | 55/DIG. 29 |
| 4,017,767 | 4/1977 | Ball | 361/117 |
| 4,025,790 | 5/1977 | Jetter et al. | 250/284 |
| 4,166,219 | 8/1979 | Ausschnitt et al. | 250/423 P |
| 4,199,685 | 4/1980 | Hora et al. | 250/423 R |
| 4,296,322 | 10/1981 | Wechsung | 250/282 |
| 4,304,124 | 12/1981 | Biblarz | 73/147 |
| 4,365,157 | 12/1982 | Unsold et al. | 250/282 |
| 4,376,637 | 3/1983 | Yang | 96/28 |
| 4,383,171 | 5/1983 | Sinha et al. | 54/67 |

(List continued on next page.)

FOREIGN PATENT DOCUMENTS

| | | |
|---|---|---|
| 91111599 | of 0000 | European Pat. Off. |
| 418746 | 12/1936 | France . |
| 886045 | 8/1953 | Germany . |
| 1023157 | 1/1956 | Germany . |
| 3630068C1 | 11/1987 | Germany . |
| 52-66884 | 6/1977 | Japan . |
| 60-226130 | 11/1985 | Japan . |

OTHER PUBLICATIONS

Smith et al., "Aerosol-Induced Air Breakdown With CO2 Laser Radiation", Journal of Applied Physics, vol. 46, No. 3, Mar. 1975, pp. 1146–1153.

(List continued on next page.)

Primary Examiner—Todd DeBoer
Assistant Examiner—Richard T. Elms
Attorney, Agent, or Firm—Perman & Green

[57] ABSTRACT

Ionization of air without the use of corona discharge tips, thereby to avoid the generation of particulates from corrosion of the corona tips, is accomplished by use of a laser beam focussed to a small focal volume of intense electric field adjacent a semiconductor chip. The electric field is sufficiently intense to ionize air. In the manufacture of a semiconductor circuit chip, during those steps which are conducted in an air environment, opportunity exists to remove from a surface of a chip, or wafer, charge acquired during the manufacturing process. The ionized air is passed along the chip surface. Ions in the air discharge local regions of the chip surface which have become charged by steps of a manufacturing process. By way of further embodiment of the invention, the ionization may be produced by injection of molecules of water into the air, which molecules are subsequently ionized by a laser beam and directed toward the chip via a light shield with the aid of a magnetic field.

9 Claims, 2 Drawing Sheets

U.S. PATENT DOCUMENTS

| | | | |
|---|---|---|---|
| 4,477,263 | 10/1984 | Shaver et al. | 55/DIG. 29 |
| 4,528,612 | 7/1985 | Spengler | 361/231 |
| 4,602,921 | 7/1986 | Shinohara et al. | 361/230 |
| 4,630,167 | 12/1986 | Huggins | 361/231 |
| 4,635,161 | 1/1987 | Le Vantine | 361/213 |
| 4,643,744 | 2/1987 | Brooks | 96/27 |
| 4,654,183 | 3/1987 | Hershcovitch | 250/423 P |
| 4,664,938 | 5/1987 | Walker | 250/281 |
| 4,716,491 | 12/1987 | Ohno et al. | 361/230 |
| 4,746,799 | 5/1988 | Mcmillian | 250/423 R |
| 4,776,515 | 10/1988 | Michalchik | 239/3 |
| 4,809,127 | 2/1989 | Steinman et al. | 361/231 |
| 4,827,371 | 5/1989 | Yost | 361/231 |
| 4,829,398 | 5/1989 | Wilson | 361/231 |
| 4,838,150 | 6/1989 | Suzuki et al. | 55/385.2 |
| 4,878,149 | 10/1989 | Stiehl et al. | 361/230 |
| 4,894,511 | 1/1990 | Caledonia et al. | 250/423 P |
| 4,994,715 | 2/1991 | Asmus et al. | 315/111.71 |
| 5,019,705 | 5/1991 | Compton | 250/423 P |
| 5,047,892 | 9/1991 | Sakata et al. | 361/231 |
| 5,057,966 | 10/1991 | Sakata et al. | 361/213 |
| 5,083,145 | 1/1992 | Gundlach et al. | 250/325 |
| 5,114,740 | 5/1992 | Plate et al. | 427/533 |
| 5,175,664 | 12/1992 | Diels et al. | 361/213 |
| 5,179,279 | 1/1993 | Millard et al. | 250/423 P |
| 5,316,970 | 5/1994 | Batchelder et al. | 437/173 |

OTHER PUBLICATIONS

Kroll et al., "Theoretical Study of Ionization of Air by Intense Laser Pulses", Physical Review, A General Physics, vol. 5, No. 4, Apr., 1972, pp. 1883–1905.

Brown et al., "Laser-Induced Gas Breakdown in the Presence of Preionization", Applied Physics Letter, vol. 22, No. 5, Mar. 1, 1973, pp. 245–247.

"Beseitigung statischer elektrischer Augladung durch radioaktive Bestrahlung", Exktrotechnik, 7 Jf., Heft 10, Oct. 1953, p. 517. (no English translation).

Haase, "Beseitigung elektrostatischer Aufladung mit Hilfe Strahlender Praparate", VDI Seitschrift, vol. 100, No. 11, Apr. 11, 1958, pp. 437–440 (no translation).

"Equivalence Between Surface Contamination Rates and Class 100 Conditions" by R. Welker, 1988 Proceedings of the Institute of Environmental Sciences, pp. 449–454.

"Effectiveness of Air Ionization in Clean Rooms", by M. Suzuki et al., 1988 Proceedings of the Institute of Environmental Sciences, pp. 405–412.

"Polarity Dependence or Electrode Erosion Under DC Corona Discharge", by R. P. Donovan, P. A. Lawless and D. D. Smith, Microcontamination, May 1986, pp. 38–49.

"Theoretical Study of Ionization of Air By Intense Laser Pulses", by N. Kroll and K. M. Watson, Physical Review A, vol. 5, 1972, pp. 1883–1905.

"Laser-Induced Gas Breakdown In The Presence of Preionization", by R. T. Brown, and D. C. Smith, Applied Physics Letters, vol. 22, 1973, pp. 245–247.

"Aerosol-Induced Air Breakdown With $CO_2$ Laser Radiation" by D. C. Smith, and R. T. Brown, Journal of Applied Physics, vol. 46, 1975, pp. 1146–1153.

GENERATION OF IONIZED AIR FOR SEMICONDUCTOR CHIPS

This is a divisional of application Ser. No. 07/895,181 filed on Jun. 5, 1992, now U.S. Pat. No. 5,316,970, which is a FWC application of Ser. No. 07/571,805 filed on Aug. 23, 1990, now abandoned.

BACKGROUND OF THE INVENTION

This invention relates to the generation of ionized air for removal of charges resident on surfaces of semiconductor chips during their manufacture and, more particularly, to the use of a sharply focused intense laser beam to ionize air in the vicinity of a semiconductor chip for discharging a surface of the chip.

During the construction of semiconductor chips having electrical circuitry thereon, the construction process entails the deposition and etching of materials as a succession of layers are built up on a surface of the chip substrate. The succession of layers must be kept free of contaminants to ensure proper operation of the chip circuitry. A primary source of contamination is the presence of particulates carried by air in the presence of the semiconductor chips. The particulates are found even in clean rooms employed for the manufacture of semiconductor chips. Typically, the clean room is provided with high efficiency filters (known as HEPA filters) for removal of airborne particles from incoming air. However, particulates are still found in clean rooms. Particulates generated in clean rooms are charged, generally. Also, charges develop upon semiconductor surfaces during the manufacture of the chips. The charges on the chip surfaces produce electric fields which create a strong attraction between the airborne particles and the corresponding oppositely charged semiconductor surfaces. This phenomenon is the primary cause for the anomalously large deposition rates of particulates of small particle size found in chip manufacture.

A technique that has been employed to reduce the foregoing attraction of particulates is to neutralize surfaces of the chip and of the various layers present in the manufacturing process, as well as to neutralize surfaces of tools employed in the manufacturing assembly line, by adding air ions to the output air stream from the foregoing filters. The technique of neutralization employs the passage of ionized air over the semiconductor surfaces. For example, typical electric fields produced by ungrounded wafers or containers are a few hundred to a few thousand volts per centimeter. The deposition rate for particles of class 100 air (100 particles per cubic foot of air) is approximately 100 times lower for environments that incorporate air ionization than for environments that do not employ the ionization. This is attributed to the neutralization effect of charges in the ionized air upon excess surface charges on the semiconductor chips. The discussion of the particle deposition rate in ionized air is presented in an article entitled "Equivalence Between Surface Contamination Rates And Class 100 Conditions" by R. Welker, 1988 Proceedings of the Institute of Environmental Sciences, Pages 449-454.

The presence of charges on the semiconductor surface presents an apparent danger to the minute circuit elements present on the chip. Contact of the semiconductor surface with an electrically conductive medium may result in a sudden discharge current flowing between two points on the semiconductor surface. Frequently, the magnitude of such current is sufficient to damage or burn out elements of the chip circuit. Also, charged regions on the surface attract small dust particles out of the air which adhere to the surface and create imperfections within the chip structure during development of subsequent layers of material in the construction of the chip circuit. Even though the voltage resulting from differential charges may be small, the resulting electric field, given in terms of volts per meter, can be enormous because of the very small distances between sites of neighboring charges. For example, such distances may be on the order of a micron or smaller with resulting electric field strengths being on the order of tens of thousands of volts per meter. It is also noted that the dust particles in the air are so small as to be carried about in the air by Brownian motion; gravity has little effect on such small particles and has little effect in inducing a settling of these particles on surfaces of the chip or tools used in fabricating the chip. Settling of the particles is accomplished by way of electrostatic forces which attract the particles to surfaces of the chip and the tools. Some of the dust particles arise from materials which may be employed in the chip manufacture.

By way of example, a plastic wafer boat holding a set of wafers might be impregnated with carbon particles to introduce electrical conductivity to the boat for rounding the wafers and reducing surface charges. However, the presence of the carbon would be a source of carbon dust. Thus, the introduction of ionized molecules in the air, such as an ionized oxygen molecule, is most useful in removal of the surface charges without acting as a source of further contaminating dust particles. The ionization process produces both positive and negative ions so as to be capable of neutralizing both negatively and positively charged regions on a surface of the chip. The ionization of the air may be viewed as introducing an electrical conductivity which bleeds off charge from the wafer, as by grounding.

Use of the corona tips for ionizing air introduces particulates, such as sputtered metal, and ions which are carried by the air to impinge upon chip surfaces. Ammonium nitrate may precipitate on the points and, thereafter, separate from the points as dust particles. The generation of particulates from the corona tips becomes exacerbated in confined spaces, as in wafer stepper apparatus employed for photolithography, because the confined spaces reduces the chance that the corona particles may escape the region of the chip by currents of air which are present normally in a clean room.

A problem with the introduction of ionized air, wherein the ionization is produced by use of corona discharge to produce the ionization, is that the ionized air itself introduces considerable particulate contamination due to the corrosion of electrode tips used in the corona discharges. This is disclosed in an article entitled "Effectiveness Of Air Ionization In Clean Rooms" by M. Suzuki, I. Matshuhasi, and I. Izumoto, 1988 Proceedings of the Institute of Environmental Sciences, Pages 405-412. Generally, the corona discharge results in a negligible amount of particles generated in typical clean-room systems in the 0.1 to 1.0 micron range; a substantial amount of particles of smaller size is produced. The production rates of the smaller particles having diameters in the range of 0.03 to 0.1 microns are between 100 and 1000 particles per cubic foot per minute. The dominant generation mechanism appears to be a sputtering of the corona tips as disclosed by R. P. Donovan, P. A. Lawless and D. D. Smith in an article entitled "Polarity Dependence of Electrode Erosion Under DC Corona Discharge", Microcontamination, May 1986, pages 38–49. In the process of ionization by use of the corona tips, the corona tips serve to concentrate locally the electric fields to a sufficient intensity for exceeding the ionization threshold of the air. However, in view of the introduction of particulate matter by the corona tips, there is a loss in effectiveness of the resulting ionized air as a means for discharging the semiconductor and the tool surfaces in the prevention of contamination of the semiconductor chips.

SUMMARY OF THE INVENTION

The aforementioned problem is overcome and other advantages are provided by an ionization of air without the use of corona discharge tips, thereby to avoid the generation of particulates from corrosion of the corona tips. During the manufacture of a semiconductor circuit chip, certain steps such as deposition of a layer on a substrate or impregnation of a layer with a dopant are conducted in a vacuum, while other steps such as photolithography are conducted in an air environment. During those steps which are conducted in an air environment, opportunity exists to employ the invention to remove from the chip charge acquired during the manufacturing process. By way of example, the charges on the chip surface may have been developed by the mechanism of triboelectricity wherein materials used in the manufacture of the chip rub against the surface of the chip.

In accordance with a preferred embodiment of the invention, the air is ionized by a laser beam focussed to a small focal volume of intense electric field adjacent a semiconductor chip, the electric field being sufficiently intense to ionize air. The air is passed along a surface of the chip. Ions in the air discharge local regions of the chip surface which have become charged by steps in a manufacturing process. By way of further embodiment of the invention, the ionization may be produced by injection of molecules of water into the air, which molecules are subsequently ionized by a laser beam and directed toward the chip via a light shield with the aid of a magnetic field.

BRIEF DESCRIPTION OF THE DRAWING

The aforementioned aspects and other features of the invention are explained in the following description, taken in connection with the accompanying drawing wherein.

DETAILED DESCRIPTION

Figure 1:
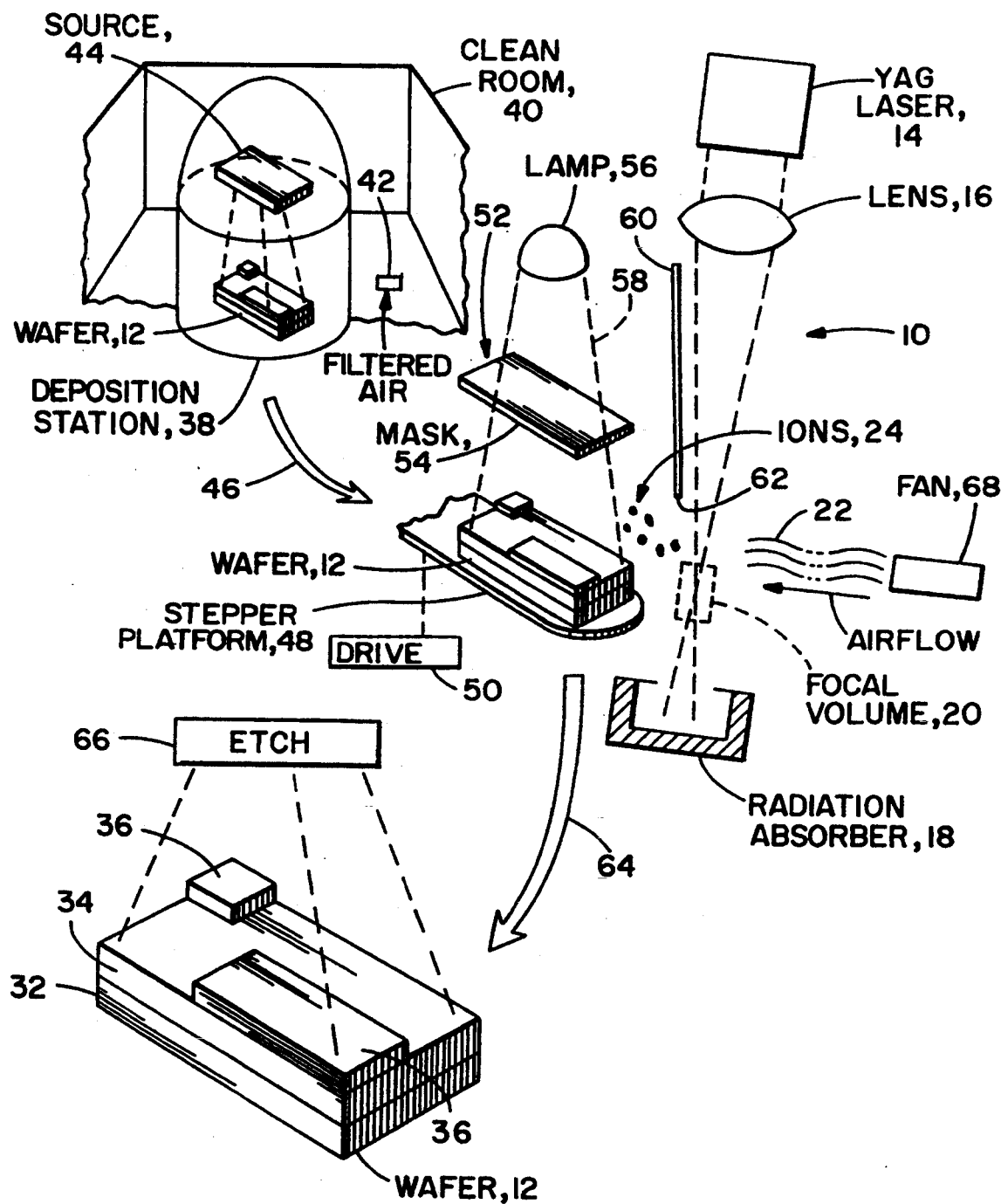
FIG. 1 shows a diagrammatic view of a sequence of steps in a semiconductor chip manufacture including a work station having ionized air produced by a laser beam in an ionization and discharge system constructed in accordance with the invention.

The practice of the invention is based on the fact that intense electric fields can cause breakdown of air in the generation of plasma. The electric fields may be microwave, infrared, optical, ultraviolet, or X-ray, as is disclosed in an article by N. Kroll and K. M. Watson entitled "Theoretical study of Ionization of Air By Intense Laser Pulses", Physical Review A, Vol. 5, 1972, Pages 1883–1905. The phenomena involved are complicated, the precise power needed to cause air to break down depending upon the laser wavelength, the duration of a pulse of the laser radiation, the focal volume in which a laser beam is focused, the density of the gas (such as the air) and its composition, and upon impurities which may be present in the gas.

By way of example in the generation of a suitable beam of laser radiation at 10.6 micron wavelength (near infrared) as is produced by a carbon-dioxide laser, pure air requires an intensity of 10 Joules per square centimeter for laser pulses having a duration shorter than 10 nanoseconds. For substantially longer duration pulses, there is required nearly $10^{10}$ watts per square centimeter. Ionization of air with substantially longer pulses of the radiation requires an intensity of nearly $10^{10}$ watts per square centimeter. The threshold values of intensity for initiating ionization typically drop for shorter wavelengths of the ionizing radiation.

Even in the case of a well-focused high-power pulsed single mode diode laser, the foregoing exemplary radiation threshold levels are difficult to achieve. By way of example with respect to the requisite optics, a numerical aperture (NA) of 0.8 with a laser having a 4 micron source (emitting facet of semiconductor laser) and an 11 degree divergence (conic angle of emitted beam) the laser can be focused to approximately 0.6 microns or approximately $3 \times 10^{-9}$ square microns. With a peak power of 30 watts in a microsecond pulse, the minimum long pulse breakdown criteria is met for the ionization of air.

There are various techniques which may be employed to reduce the requisite threshold of laser beam intensity sufficiently so as to make practical a laser ionizer. One technique is to preionize the air with charged particles. A second technique is to include aerosol particles in the focal volume. A third technique is to use magnetic fields to protect surfaces of nearby objects, such as a semiconductor chip, from ion bombardment, and to help separate ions of differing charge.

Preionization has been demonstrated to reduce gas breakdown threshold by substantial amounts, as disclosed in an article by R. T. Brown and D. C. Smith, entitled "Laser-Induced Gas breakdown in the Presence of Preionization", Applied Physics Letters, Vol. 22, 1973, pages 245–247. Ion densities in the gas preceding the laser pulse and having a value of approximately $10^{13}$ ions per cubic centimeter lower the thresholds for ionization by carbon-dioxide laser radiation by approximately one order of magnitude. The volume of a focused laser diode spot is approximately $10^{-13}$ cubic centimeters. This volume suggests that several ions in the focal volume will be accelerated by the electric fields of the ionizing radiation to encourage the ions to cascade against other atoms to initiate the breakdown process of air molecules into ions. This effect may be created by a radioactive source near the focal volume, as well as by a pulsed electron beam injector (a vacuum tube with a window for exiting electrons) near the focal volume. In this mode, the laser acts essentially as an ion concentration amplifier.

In a preferred embodiment of the invention, ionization of air is accomplished by use of a Q-switched laser of neodymium yttrium-aluminum-garnet, and will be described below with reference to FIG. 1. The laser outputs coherent radiation which is focused by a lens into a focal region adjacent a wafer employed in the construction of a semiconductor circuit. The intense radiation generates intense heat, possibly 10,000 degrees Centigrade, which breaks up molecules of air such as oxygen molecules, to produce both positively and negatively charged ions. In the presence of an applied electric field, the applied field tends to separate the positive and the negative ions so as to produce a cloud of ions which can be brought into contact with the wafer by a flowing of the air past a surface of the wafer. The laser is operated by a flash lamp, energy of the lamp being absorbed in the material of the laser to pump up the electrons to a high energy level. Radiated power in the range of 3–10 megawatts for a duration of a few nanoseconds is produced by the laser. The focal volume has a circular cylindrical shape having a size, typically, with diameter of 10 microns and a length of 50 microns.

In an alternative mode of practice of the invention, ionization of the air is accomplished by introduction of aerosol particles into the focal volume, as will be described below with reference to FIG. 2. As disclosed in an article by D. C. Smith and R. T. Brown, entitled "Aerosol-Induced Air Breakdown with $CO_2$ Laser Radiation", Journal of Applied Physics, Vol. 46, 1975, Pages 1146–1153, small particles in the focal volume of a carbon dioxide laser cause the breakdown threshold of the air in the focal volume to drop approximately two orders of magnitude to an intensity having a value $10^8$ water per square centimeter. This change of threshold value appears to be independent of the composition of the aerosol in view of the disclosed use of carbon, clay, aluminum, germanium, and common salts. At the disclosed intensity level, the peak power required of a laser diode would be less than one watt, this being achieved today by commercially available laser diodes. As will be described with reference to FIG. 3, the aerosols will be provided in the alternative embodiment of the invention by use of water droplets produced by a vibrating orifice particle generator operating with highly purified water. The resulting droplets are very small, having a diameter of approximately one-half micron, and are generated periodically and irradiated by the laser to create showers of ions. The utilization of the water as a source of ions is most efficient because, in the absence of evaporative losses of water, a one milliliter sample of water would produce a droplet per second for thousands of years. Therefore, in the alternative embodiment of the invention, a small reservoir incorporated in the ionizer suffices to provide adequate water, there being no need for external plumbing.

It is interesting to note, that with respect to ionizers employing electrodes in the prior art, that the electrodes are sputtered when neutral molecules near the electrodes break apart into ions due to the high fields. This may be likened to a surface tension of material about the electrode. One of the resulting ions must have the opposite charge as the electrodes, and this ion is accelerated towards and impacts upon the electrode. The use of a magnetic field can control the direction of movement of the ions, so as top prevent an oppositely charged ion from impacting the electrode. With respect to the alternative embodiment of the invention, the magnetic field can also be used to direct ions in a preferred direction of travel. This is accomplished by placing the magnetic field lines, in the manner of a magnetic mirror, parallel to the surfaces to be protected, and along the direction in which the ions are to travel. The magnetic field interacts with the moving charged particles to direct the particles in a preferred direction, and thereby insulate the surfaces from the slower heavier ions. The magnetic field also tends to break up the ambipolar diffusion of oppositely charged ions thereby impeding a recombination of the positive and the negative ions.

FIG. 1 shows an optical system 10 useful in the practice of the invention for the generation of ionized air for the discharging of a semiconductor wafer 12. The system 10 is useful generally for the ionization of air for neutralization of electric charges found on the surfaces of various objects, including tools useful in the fabrication of semiconductor circuits as well as charges found on the surfaces of layers of material used in the construction of circuitry on a semiconductor wafer, such as the wafer 12. In order to show utility of the system 10 in the manufacture of a semiconductor product, FIG. 1 shows a succession of three stages in the many stages or steps customarily employed in the manufacture of a semiconductor product, particularly the wafer 12 which is to incorporate electronic circuitry upon completion of the manufacture of the wafer 12. Also, by way of example, the three stages are shown at three different work stations where manufacturing processes are to be performed upon the wafer 12.

The optical system 10 is constructed in accordance with a preferred embodiment of the invention, and includes the aforementioned yttrrium-aluminum garnet (YAG) laser 14 wherein the YAG is doped with neodymium. The laser 14 employs standard constructional features including a flash lamp (not shown) and a Q-switching optical element (not shown) for providing high-intensity short-duration pulses of radiation. The system 10 includes a lens 16 and a radiation absorber 18, the lens 16 lying on an optical path by which the pulses of radiation propagate from the laser 14 to be absorbed within the absorber 18. The lens 16 brings the radiation to a sharp focus within a focal volume 20 wherein the radiation is sufficiently intense to ionize molecules of air 22 to produce ions 24.

Figure 2:
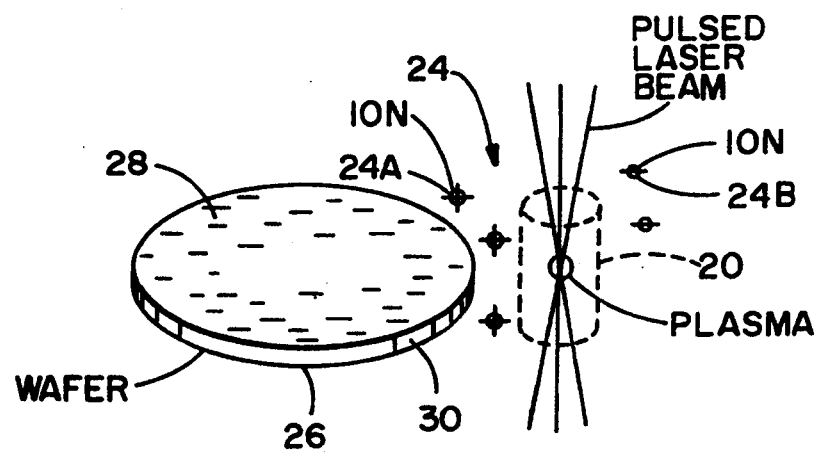
FIG. 2 is a stylized view of a charged wafer receiving ions from plasma of a laser beam.

FIG. 2 shows the generation of the ions 24 in an enlarged stylized view. The intensity of the beam of pulsed laser radiation, within the focal volume 20, is sufficiently intense to produce a plasma containing the ions 24, some of the ions being positive ions 24A and some of the ions being negative ions 24B. The focal volume 20 is located adjacent a wafer 26 shown, by way of example, as a flat disk having an upper surface having regions which are negatively charged. The negatively charged regions attract the positive ions 24A with a resultant discharge of the charged regions and neutralization of the wafer 26. The focus of the laser beam is located at a distance of approximately 2–3 inches from the lens 16 (FIG. 1). The focal volume 20 is spaced apart from the wafer 26 (FIG. 2), or from the wafer 12 (FIG. 1) by a distance of approximately ⅛ inch from the wafer surface. The intense temperatures of the plasma, as well as the intense electric field of the laser beam in the focal volume 20 inhibit recombination of the positive ions 24A with the negative ions 24B so that a cloud of the ions 24 can be moved over the wafer surface by a flow of the air 22 through the focal volume 20 and along the charged surface of the wafer. In order to maximize contact of the ion cloud with a top surface 28 of the wafer 26 (FIG. 2), the center of the focal volume 20, this being the location of the focus of the laser beam, is positioned approximately ⅛ inch in front of the plane of the top surface 28, and ⅛ from the cylindrical surface of the edge 30 of the wafer 26.

The wafer 12 is shown with a different configuration than that of the wafer 26 to demonstrate that the optical system 10 is operable with objects of different sizes and shapes. Also, the wafer 12 shows plural layers of material, the layers including a substrate 32, a middle layer 34 and a top layer 36. The top layer 36 is divided into a plurality of sections, two of which are shown in FIG. 1, to demonstrate the construction of portions of circuit elements. Typically, in the construction of a plurality of circuit chips on a semiconductor wafer, the thicknesses of the layers, as measured in a direction perpendicular to a plane of the substrate 13, is very small compared to the above-noted spacing of ⅛ between the focus of the laser beam and the charged surface which is to be neutralized. Therefore, there is no need to reposition the wafer 12 as subsequent layers are added to the wafer in the manufacturing process, which layers are to be neutralized by the ionized air of the optical system 10.

In FIG. 1, in the exemplary use of the optical system 10 in a stage of manufacture of the electrical circuitry of the semiconductor wafer 12, the wafer 12 is shown in a partial stage of completion in a sequence of steps taken from a procedure of many steps employed in the manufacture. In the first step, the wafer 12 is disposed in a vacuum chamber 38 located in a clean room 40. Filtered air enters the clean room 40 via a duct 42 in a floor of the room 40. The chamber 38 is employed for deposition of layers of material on the wafer 12, and for the application of dopants to the wafer 12. By way of example, FIG. 1 shows a source 44 of photoresist dispensing the photoresist, within the chamber 38, upon the wafer 12 to coat the surface of the top layer 36 with photoresist.

The manufacturing process proceeds via arrow 46 to a further stage in the manufacturing process wherein the wafer 12 is removed from the vacuum chamber 38 and placed upon a platform 48 of stepper apparatus which includes an electromechanical drive 50 for moving the platform 48 to position the wafer 12 in a photolithographic station 52.

The photolithographic station 52 includes a mask 54, and a lamp 56 which projects light 58 through the mask 54 to expose the photoresist with an image provided by the mask 54. It is to be understood that the term "light" employed in the photolithographic station 52 may include light of the visible spectrum, as well as infrared light, ultraviolet light, and radiation of other portions of the spectrum such as x-radiation. The light 58 exposes the photoresist at those portions of the mask image wherein the light impinges upon the photoresist, thereby to sensitize specific regions of the photoresist to a chemical bath employed in a subsequent etching step.

In accordance with a feature of the invention, triboelectric charges which may have been induced upon the photoresist during the process of deposition of the photoresist in the chamber 38 are removed by passing the ionized air from the optical system 10 across the surface of the wafer 12 so as to contact the charged regions of the photoresist with the ions 24. This is accomplished, as has been noted above, by locating the wafer 12 adjacent the focal volume 20 of the optical system 10. By way of example, the locating of the wafer 12 can be accomplished by movement of the platform 48 to bring the wafer 12 to a designated position adjacent the focal volume 20. In view of the fact that the photoresist is sensitive to light in a specific range of frequencies, which range of frequencies might include light produced by an ionizing optical system such as the system 10, it may be desirable to include a light shield 60 positioned between the laser beam of the system 10 and the photolithographic station 52 to prevent the possibility of scattered rays of radiation of the laser beam from impinging upon the wafer 12. The ionized air would flow through a passage 62 in the light shield 60.

The manufacturing process then proceeds via arrow 64 to a further stage wherein the wafer 12 is applied with an etchant from a source 66 of etchant which removes regions of photoresist designated by the pattern of exposure of the photolithographic station 52. The wafer 12 is ready now to receive a subsequent layer of material in the vacuum chamber 38. If desired, prior to returning the wafer 12 to the vacuum chamber 38, the wafer 12 may be exposed again to the ionized air of the optical system 10 to neutralize any charge which may have developed by use of the etchant. In general it is presumed during the manufacturing process, that the wafer 12 will be returned numerous times to the location adjacent the focal volume 20 for neutralization of any charges which may have developed during a preceding step of the manufacture.

It is also noted, by way of convenience in the use of the invention, that it is possible to employ a plurality of systems such as the system 10 for neutralizing the wafer 12 at various locations within the manufacturing process. Alternatively, it is possible to move, or reorient, the system 10 to treat the wafer 12 at various locations of the manufacturing process. Also, it should be noted that it may be possible to accomplish a number of the manufacturing steps by retaining the wafer 12 in a fixed location adjacent the focal volume 20 by moving tools, such as the mask 54 to allow deposition of a further material, such as the etchant, in which case the wafer 12 remains in position for receiving the ionized air. It is also understood that the etchant might be applied by dipping the wafer 12 in a bath of etchant (not shown) after which the wafer 12 would be returned to the location adjacent the focal volume 20 for neutralization of charges which may have developed during the etching.

By way of further example in the manufacturing procedure, the wafer 12 may receive a dopant in the vacuum chamber 38, after which the wafer 12 would be placed alongside the focal volume 20 of the system 10 to neutralize any charges which may have occurred in the dopant process. In general, the presentation of the vacuum chamber 38 in FIG. 1 is intended to represent a variety of manufacturing steps which may result in the formation of electric charges on a surface of the wafer 12, which charges are to be neutralized by conveying the wafer 12 to the location adjacent the focal volume 20. The air used in producing the ionized air is obtained from the filtered air provided by the duct 42 of the clean room 40 to insure freedom of contamination of the wafer 12 during the manufacturing process. With respect to the flow of air 22 through the focal volume 20 towards the wafer 12, the available convection of air present in the clean room 40 may be employed as the source of air flow or, if desired, a fan 68 may be employed to generate the air flow and direct the air flow in the desired direction across the wafer 12.

Figure 3:
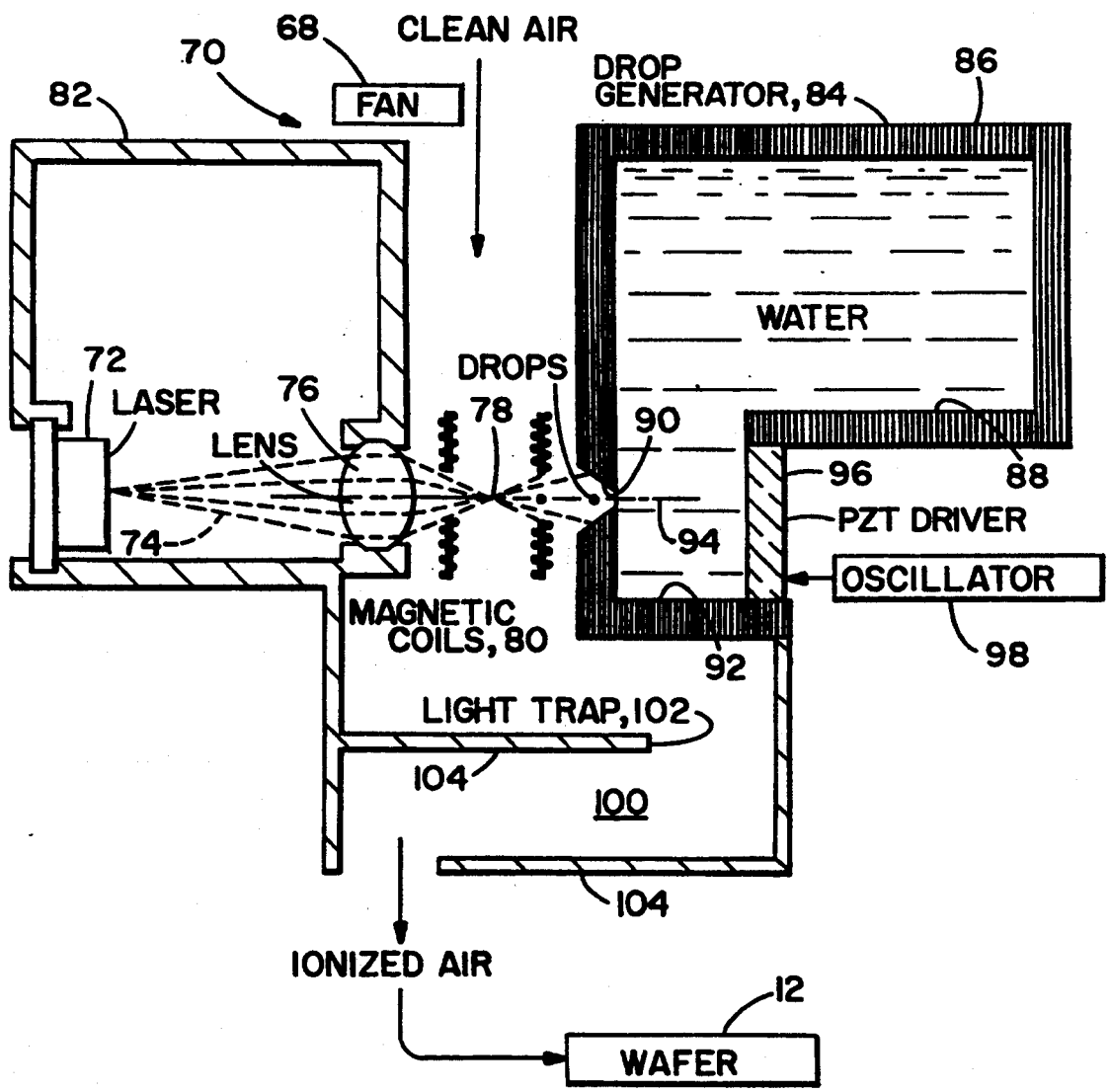
FIG. 3 shows a diagrammatic view of ionization apparatus employing water droplets in accordance with an alternative embodiment of the invention.

FIG. 3 shows a system 70 for ionizing air, the system 70 being an alternative embodiment of the system 10 of FIG. 1. In FIG. 3, the system 70 employs a laser 72 transmitting radiation 74 through a lens 76, the lens 76 focusing the radiation 74 to converge at a focus 78. The system 70 includes magnetic coils 80 which enclose the focus 78, and are activated by current provided by a suitable current source (not shown) to provide a magnetic field directed along an axis of the lens 76. A housing 82 positions the laser 72 and the lens 76 relative to each other and relative to the coils 80.

The system 70 further comprises a drop generator 84 having a housing 86 defining a reservoir 88 for the storage of water. An orifice 90 is provided in a lower chamber 92 of the reservoir 88 for the egress of droplets of water, the orifice 90 being positioned along a common axis of the coils 80. The axis 94 coincides with the axis of the lens 76 and passes through the focus 78. A PZT (lead-zirconate-titanate ceramic) driver 96 is located in a back wall of the chamber 92 opposite the orifice 90 for inducing vibrations in the water of the reservoir 88. The vibrations of the water result in the generation of minute droplets of water which exit via the orifice 90 to pass through the coils 80 along the axis 94 into the focus 78. An oscillator 98 electrically activates the driver 96 to vibrate at the frequency of oscillation of the oscillator 98.

In operation, the radiation 74 of the laser 72 is concentrated by the lens 76 to a sufficient intensity at the focus 78 to ionize the droplets of water exiting the orifice 90. Ionization of the droplets converts the droplets into charged particles which interact with the magnetic field of the coils 80. Any component of velocity of a charged droplet which is normal to the magnetic field produces a force which is perpendicular to both the field and the velocity component resulting in a spiral movement of the charged droplet about the axis 94. Positively and negatively charged droplets spiral in opposite directions about the axis 94. This movement of the charged, or ionized, droplets aids in maintaining a separation between positively and negatively charged droplets as they propagate through an environment of air in the vicinity of the focus 78.

The ionized droplets are carried by an air stream which is guided through a channel 100 formed within a light trap 102. By way of example, the light trap 102 may be formed of metallic vanes 104 extending from the housings 82 and 86. The presence of the charged droplets in the air constitutes ionized air. The fan 68 of the system 10 of FIG. 1 may also be employed in the system 70 of FIG. 3 for blowing air of the clean room 40 through the focus 78 and the channel 100 to pass over the wafer 12. Passage of the ionized air over the surface of the wafer 12 provides for interaction of the ionized air with charged regions of the surface of the wafer 12 for neutralizing the charges as was described above for the manufacturing process of FIG. 1.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A system operative with a flow of air for generating contamination-free ionized air to discharge an object, the system comprising:
    a source of radiation;
    means for concentrating the radiation in a focal volume of the source to provide sufficient intensity of radiation to ionize the air; and
    means for locating an edge of the object within the air flow and adjacent the focal volume to discharge the object by ions borne by the air, said locating means providing the focal volume at a side of the object to reduce illumination of a surface of the object by plasma in the focal volume.

2. A system according to claim 1 further comprising means for transporting the air from the focal volume to the object to bring the ions of the ionized air in contact with charged regions on a surface of the object.

3. A system according to claim 2 wherein said radiation is coherent radiation, and said source of radiation is a laser producing a beam of said coherent radiation, said object being a semiconductor wafer.

4. A system for generating contamination-free ionized air for discharging an object during a photolithographic process of manufacture of the object, the process of manufacture including a depositing of photosensitive material on a surface of the object, the system comprising:
    means for concentrating coherent radiation optically in a focal volume, wherein said concentrating means is operative to provide a converging of rays of radiation to said focal volume;
    means for ionizing air by flowing the air via the focal volume to the object, the flowing of the air via the focal volume allowing the radiation to ionize the air;
    means for locating the object relative to said focal volume such that said focal volume is adjacent an edge of the object for in-situ ionization of the air near the object, the locating means allowing rays of radiation to pass by the object, there being a plasma in said focal volume emitting a further radiation;
    wherein said locating means locates said object relative to said focal volume to provide for a shielding of the photosensitive material of the surface of the object from at least one of said coherent radiation and said further radiation; and
    wherein a flow of the ionized air past the surface of the object provides for a discharging of the object, said system being operative to permit said discharging during said process of manufacture.

5. A system according to claim 4 further comprising a laser for producing a beam of said coherent radiation, said system further comprising an opaque shield disposed between the laser beam and the photosensitive material to provide said shielding of the photosensitive material from said coherent radiation.

6. A system according to claim 4 wherein the surface holding the photosensitive material is planar, and said focal volume is located behind a plane of the surface holding the photosensitive material to accomplish said shielding.

7. A system according to claim 5 wherein the surface holding the photosensitive material is planar, and said focal volume is located behind a plane of the surface holding the photosensitive material to accomplish said shielding.

8. A system according to claim 7 wherein said focal volume is located at a distance of approximately one-eighth inch from the side of the object, and at a distance of approximately one-eighth inch behind said plane.

9. A system according to claim 8 wherein said focal volume has a maximum dimension of approximately 50 microns.

* * * * *